US 12,112,966 B2

(12) United States Patent
Omori et al.

(10) Patent No.: US 12,112,966 B2
(45) Date of Patent: Oct. 8, 2024

(54) ARTICLE ACCOMMODATION FACILITY

(71) Applicant: Daifuku Co., Ltd., Osaka (JP)

(72) Inventors: Kazuya Omori, Hinocho (JP); Akira Masui, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 288 days.

(21) Appl. No.: 17/827,202

(22) Filed: May 27, 2022

(65) Prior Publication Data

US 2022/0380124 A1 Dec. 1, 2022

(30) Foreign Application Priority Data

May 28, 2021 (JP) .................................. 2021-090501

(51) Int. Cl.
*H01L 21/677* (2006.01)
*B65G 1/04* (2006.01)
*B65G 1/06* (2006.01)

(52) U.S. Cl.
CPC ........ *H01L 21/6773* (2013.01); *B65G 1/0421* (2013.01); *H01L 21/67769* (2013.01); *B65G 1/0407* (2013.01); *B65G 1/06* (2013.01); *B65G 2201/0297* (2013.01); *Y10S 414/14* (2013.01)

(58) Field of Classification Search
CPC .......... B65G 1/0421; B65G 2201/0297; B66F 9/0755; H01L 21/6773; H01L 21/67769; Y10S 414/14
See application file for complete search history.

(56) References Cited

U.S. PATENT DOCUMENTS

| 5,466,109 | A  | * | 11/1995 | Lizuka | H01L 21/67769 |
| | | | | | 414/940 |
| 10,283,394 | B2 | * | 5/2019 | Abe | H01L 21/67379 |
| 10,354,898 | B2 | * | 7/2019 | Abe | H01L 21/67276 |
| 10,431,485 | B2 | * | 10/2019 | Abe | H01L 21/67733 |
| 11,034,519 | B2 | * | 6/2021 | Sai | H01L 21/67736 |
| 11,345,541 | B2 | * | 5/2022 | Abe | H01L 21/67775 |

FOREIGN PATENT DOCUMENTS

JP        2007126254 A    5/2007

* cited by examiner

*Primary Examiner* — James Keenan
(74) *Attorney, Agent, or Firm* — The Webb Law Firm

(57) ABSTRACT

A transfer machine raises and lowers a support portion in a transfer operation between a lower set position that is set below a placement portion of a transfer location subject to the transfer operation, and an upper set position that is set above the placement portion, and a control device changes setting of at least one of the lower set position and the upper set position to set a different raising/lowering range of the support portion that covers a range from the lower set position to the upper set position, between a case where an article is transferred to the transfer location provided in a storage/retrieval section, and a case where the article is transferred to the transfer location provided in accommodation sections.

5 Claims, 6 Drawing Sheets

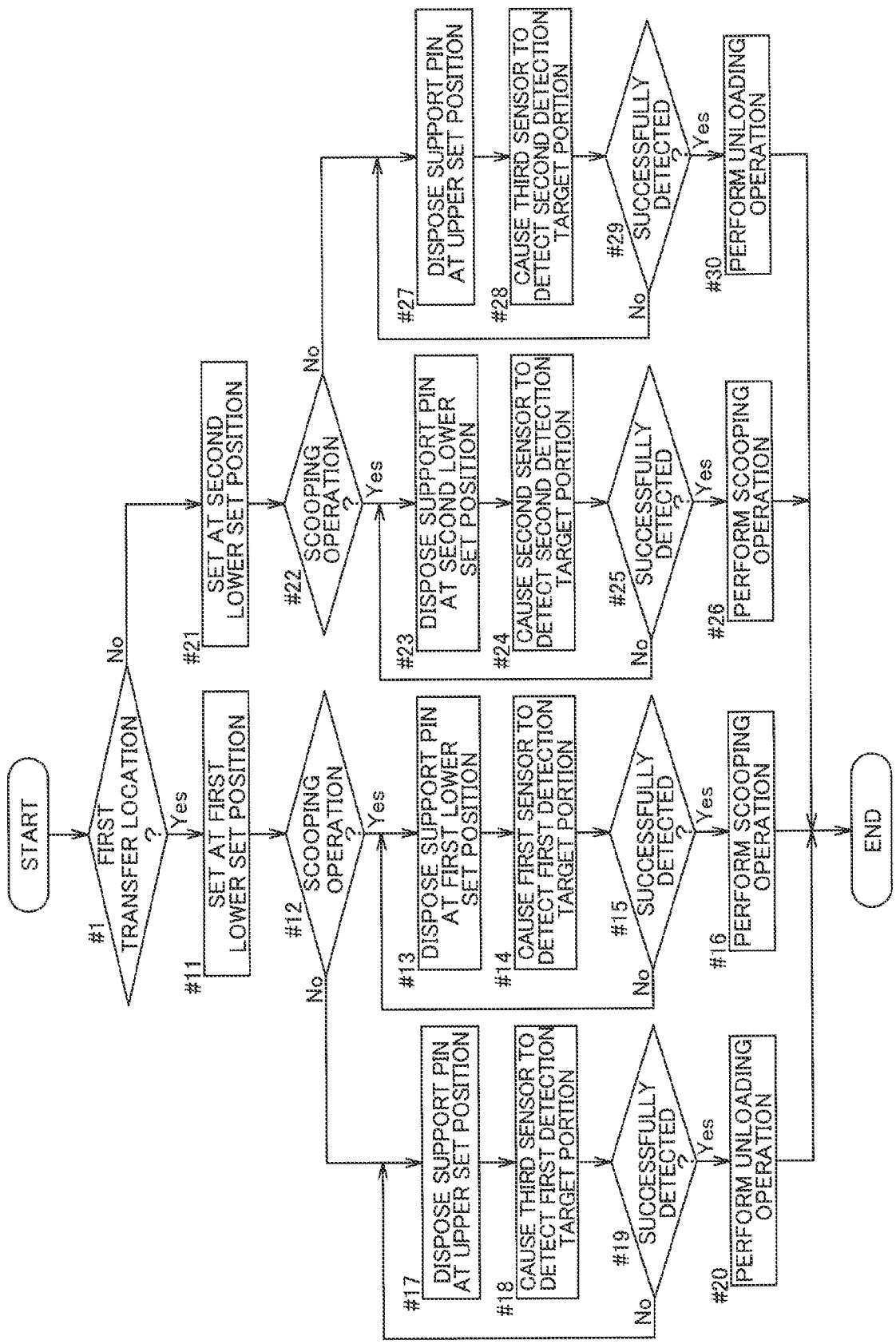

ARTICLE ACCOMMODATION FACILITY

CROSS-REFERENCE TO RELATED APPLICATION

This application claims priority to Japanese Patent Application No. 2021-090501 filed May 28, 2021, the disclosure of which is hereby incorporated by reference in its entirety.

BACKGROUND OF THE INVENTION

1. Field of the Invention

The present invention relates to an article accommodation facility.

2. Description of the Related Art

In an article accommodation facility, articles are stored and transported using an article accommodation rack that accommodates the articles, and a transport device that transports the articles. An example of such an article accommodation facility is disclosed in JP 2007-126254A (Patent Document 1). In the following, the reference numerals shown in parentheses in the description of the related art are those of Patent Document 1.

According to the technique disclosed in Patent Document 1, a slide fork (24) for transferring an article is provided with mark sensors (26, 27), and a rack bracket (34) for accommodating the article is provided with a mark (36). When transferring an article to the rack bracket (34), whether or not the slide fork (24) is located at a proper position for the transfer can be determined based on the detection of the mark (36) performed by the mark sensors (26, 27).

SUMMARY OF THE INVENTION

In the case of transferring an article to a transfer location such as the rack bracket (formed by a pair of plate members spaced apart from each other) disclosed in Patent Document 1, using a fork configured to support the article from below, the fork needs to be projected/retracted and raised/lowered. That is, the positioning in the vertical direction relative to the transfer location is performed by raising or lowering the fork, and the positioning in the horizontal direction relative to the transfer location is performed by projecting or retracting the fork. Thereafter, the fork is further raised or lowered relative to the transfer location, thus receiving the article from the transfer location, or delivering the article to the transfer location. In this manner, the transfer of an article involves projection/retraction and raising/lowering of the fork, and the space for projecting/retracting and raising/lowering the fork is inevitably required at the transfer location. However, when a plurality of transfer locations having different structures are present, the operational range of the fork may be restricted depending on the structures of the transfer locations. Patent Document 1 has no specific description relating to this point.

In view of the above-described circumstances, it is desirable to realize a technique by which, when a plurality of transfer locations having different structures are present, it is possible to perform an appropriate transfer operation suitable for each of the transfer locations.

A technique for solving the above-described problem is as follows.

An article accommodation facility including:
an article accommodation rack including a plurality of accommodation sections each configured to accommodate an article;
a storage/retrieval section configured to store the article on the article accommodation rack, and retrieve the article from the article accommodation rack;
a transport device configured to transport the article; and
a control device configured to control the transport device,
wherein the transport device includes a transfer machine configured to transfer the article to and from a transfer location provided in each of the plurality of accommodation sections and the storage/retrieval section,
the transfer machine includes a fork configured to support the article from below, a projection/retraction mechanism configured to project and retract the fork between a retracted position and a projecting position in a projecting/retracting direction extending in a horizontal direction, and an elevation mechanism configured to raise and lower the fork, and is configured to perform a transfer operation for transferring the article to and from the transfer locations by projecting or retracting and raising or lowering the fork,
each of the transfer locations has a placement portion where the article is placed, and a support portion where the fork supports the article,
the transfer machine raises and lowers the support portion in the transfer operation between a lower set position that is set below the placement portion of the transfer location subject to the transfer operation, and an upper set position that is set above the placement portion, and
the control device changes setting of at least one of the lower set position and the upper set position to set a different raising/lowering range of the support portion that covers a range from the lower set position to the upper set position, between a case where the article is transferred to the transfer location provided in the storage/retrieval section, and a case where the article is transferred to the transfer location provided in each of the accommodation sections.

With this configuration, even in the case where the restriction on the raising/lowering range of the support portion during the transfer operation differs according to the transfer location, including, for example, a case where the structure of the transfer location provided in the storage/retrieval section and the structure of the transfer location provided in the accommodation section differ from each other, it is possible to set an appropriate raising/lowering range suitable for each of the transfer locations, and transfer the article appropriately. Accordingly, with this configuration, when a plurality of transfer locations having different structures are present, it is possible to perform an appropriate transfer operation suitable for each of the transfer locations.

Further features and advantages of the technique according to the present disclosure will become apparent from the following description of illustrative and non-limiting embodiments with reference to the drawings.

BRIEF DESCRIPTION OF THE DRAWINGS

FIG. 8 is a flowchart illustrating a processing procedure of control performed in the article accommodation facility

DETAILED DESCRIPTION OF PREFERRED EMBODIMENTS

Hereinafter, an embodiment of the article accommodation facility will be described, taking as an example, a case where the article accommodation facility is used for a semiconductor manufacturing plant. In the present embodiment, an article is a container in which a storage target object is storable. Here, the article is configured to store, as the storage target object, a semiconductor substrate formed by a semiconductor wafer or the like. Examples of the container that constitutes an article include a front opening, box-shaped container called a FOUP (Front Opening Unified Pod). The article accommodation facility according to the present embodiment performs the storage and the transport of such articles.

Figure 1:
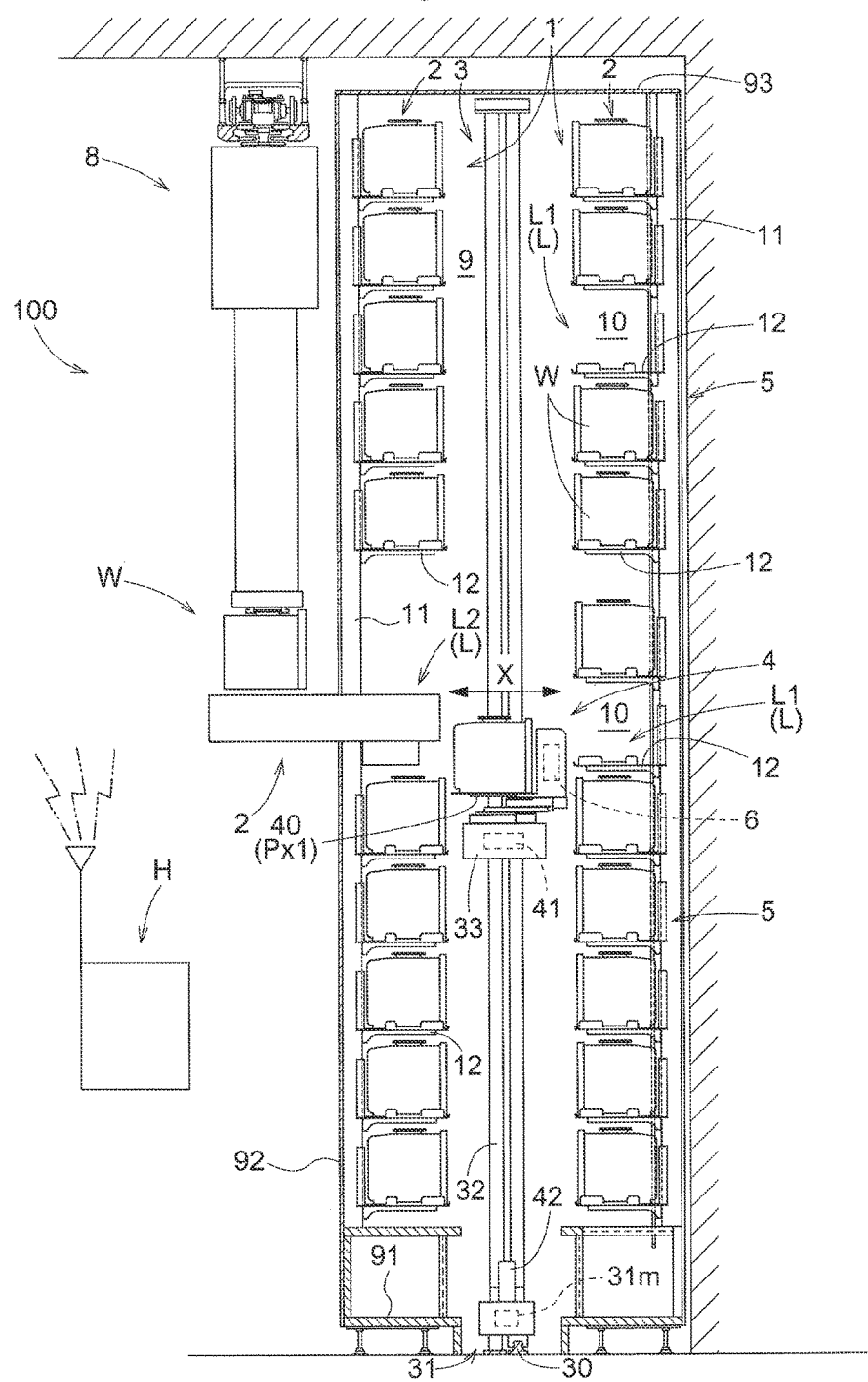
FIG. 1 is a side view of an article accommodation facility.

As shown in FIG. 1, an article accommodation facility 100 includes at least one article accommodation rack 1 including a plurality of accommodation sections 10 that each accommodate the article W, a storage/retrieval section 2 that stores the article W in the article accommodation rack 1, and retrieves the article W from the article accommodation rack 1, a transport device 3 that transports the article W, and a control device 6 that controls the transport device 3. The transport device 3 includes a transfer machine 4 that transfers the article W to and from a transfer location L provided in each of the plurality of accommodation sections 10 and the storage/retrieval section 2. Accordingly, the transport device 3 can transport the article W to and from each of the plurality of accommodation sections 10, and transport the article W to and from the storage/retrieval section 2. In the present example, the article accommodation facility 100 includes an overall control device H that manages the entire facility. Based on instructions issued from the overall control device H, the various sections and devices included in the article accommodation facility 100 perform operations corresponding to the instructions.

In the present embodiment, the article accommodation facility 100 includes an accommodation compartment 9. The accommodation compartment 9 is a space surrounded by a floor portion 91, a peripheral wall portion 92, and a ceiling portion 93. In the present example, the accommodation compartment 9 is maintained in a clean environment, and the article accommodation rack 1 and the transport device 3 are disposed inside the accommodation compartment 9. In the illustrated example, inside the accommodation compartment 9, a pair of article accommodation racks 1 are disposed on opposite sides of the transport device 3 in the horizontal direction. The transport device 3 is configured to transport the article W in a transport space formed between the two article accommodation racks 1.

In the present embodiment, the article accommodation facility 100 includes gas supply sections 5 that each supply a gas into the article W. The gas supply sections 5 are provided one-to-one correspondence with the plurality of accommodation sections 10 included in the article accommodation rack 1, and are configured to supply a gas into the articles W accommodated in the corresponding accommodation sections 10. In the present embodiment, one of the two article accommodation racks 1 is a "purge rack" in which the gas supply sections 5 are installed, and the other is a "non-purge rack" in which no gas supply section 5 is installed. The purge rack and the non-purge rack basically have the same structure except for the presence or absence of the gas supply section 5.

In the present embodiment, each article accommodation rack 1 is provided with a plurality of accommodation sections 10 arranged in a plurality of rows and a plurality of columns. In other words, the plurality of accommodation sections 10 are arranged in the vertical direction and the horizontal direction. A transfer location L to which the transfer machine 4 of the transport device 3 is to transfer the article W is provided in each of the plurality of accommodation sections 10. Hereinafter, the transfer location L provided in each of the accommodation sections 10 of the above-described "purge rack" of the pair of article accommodation racks 1 may be referred to as the "first transfer location L1".

In the present embodiment, each article accommodation rack 1 includes a plurality of struts 11 and a plurality of placement plates 12. The plurality of struts 11 are each disposed extending in the vertical direction, and are spaced apart from each other in the horizontal direction. Each of the plurality of placement plates 12 is a member on which the article W is placed, and is supported by the corresponding strut 11 or struts 11. In the present example, the placement plate 12 is supported in a cantilevered manner in such a manner as to have a free end on the above-described transport space (the space in which the transport device 3 is provided) side and a fixed end on the opposite side, by a pair of struts 11 to which the end of the placement plate 12 located opposite to the transport space is adjacent. Here, one accommodation section 10 is provided for one placement plate 12. The article W is accommodated in the accommodation section 10 while placed on the placement plate 12.

In the present embodiment, the storage/retrieval section 2 is configured to transport the article W between the inside and the outside of the accommodation compartment 9. The storage/retrieval section 2 stores an article W into the article accommodation rack 1 by transporting the article W from the outside to the inside of the accommodation compartment 9, and retrieves an article W from the article accommodation rack 1 by transporting the article W from the inside to the outside of the accommodation compartment 9. In the present example, the storage/retrieval section 2 is configured as a conveyor, and transports the article W with the article W placed thereon. Also, the storage/retrieval section 2 is provided extending through the peripheral wall portion 92 in the horizontal direction. A transfer location L to which the transfer machine 4 of the transport device 3 is to transfer the article W is provided at a portion of the storage/retrieval section 2 that is disposed inside the accommodation compartment 9. Hereinafter, the transfer location L provided in the storage/retrieval section 2 may be referred to as the "second transfer location L2".

In the present embodiment, the article accommodation facility 100 includes an external transport device 8 that transports the article W outside the accommodation compartment 9. The external transport device 8 transfers the article W between the external transport device 8 and a portion of the storage/retrieval section 2 that is disposed outside the accommodation compartment 9. In the illustrated example, the external transport device 8 is configured as a ceiling guided vehicle that transports the article W in the vicinity of the ceiling, and transfers the article W to the storage/retrieval section 2 from above.

The transport device 3 is configured to transport the article W between the storage/retrieval section 2 and any one of the plurality of accommodation sections 10, and between any one of the plurality of accommodation sections 10 and another accommodation section 10. In the present embodiment, the transport device 3 includes a travel rail 30 installed along the article accommodation racks 1 in the horizontal direction, a traveler 31 that travels along the travel rail 30 by being driven by a travel motor 31m, a mast 32 extending upward from the traveler 31, and an elevation body 33 that is raised and lowered along the mast 32. In the present example, the transfer machine 4 is installed on the elevation body 33. The transfer machine 4 is movable together with the elevation body 33 in the horizontal direction, in which the travel rail 30 extends, and the vertical direction, in which the mast 32 extends. Accordingly, the transfer machine 4 can transfer the article W to each of the plurality of accommodation sections 10 (first transfer locations L1) arranged in the vertical direction and the horizontal direction. The transfer machine 4 can also transfer the article W to the second transfer location L2 in the storage/retrieval section 2 that is disposed within a transport range of the transport device 3 in the vertical direction and the horizontal direction.

The transfer machine 4 includes a fork 40 that supports the article W from below, a projection/retraction mechanism 41 configured to project and retract the fork 40 between a retracted position Px1 and a projecting position Px2 (see FIGS. 4 and 5) in a projecting/retracting direction X extending in the horizontal direction, and an elevation mechanism 42 configured to raise and lower the fork 40, and is configured to perform a transfer operation for transferring the article W to and from the transfer machine 4 and the transfer locations L by projecting or retracting and raising or lowering the fork 40. FIG. 1 shows a state in which the fork 40 is located at the retracted position Px1.

In the present embodiment, the projection/retraction mechanism 41 includes a link mechanism configured to support the fork 40 at a distal end portion thereof, and a projection/retraction motor that drives the link mechanism. In the present example, the fork 40 is configured as a part of a so-called SCARA (Selective Compliance Assembly Robot Arm).

In the present embodiment, the elevation mechanism 42 includes an endless body such as a belt, a rotational body such as a pulley on which the endless body is wound, and an elevation motor that rotationally drives the rotational body. In the present example, the elevation and the lowering of the fork 40 are realized by the raising and the lowering of the elevation body 33. That is, the fork 40 supported by the elevation body 33 is raised and lowered as the elevation body 33 is raised and lowered.

As described thus far, as the transfer locations L to which the article W is to be transferred by the transfer machine 4, the first transfer location L1 and the second transfer location L2 are provided in the article accommodation facility 100. The first transfer location L1 is provided in each of the plurality of accommodation sections 10 (the plurality of accommodation sections 10 of the purge rack in the present example). The second transfer location L2 is provided at a portion of the storage/retrieval section 2 that is disposed inside the accommodation compartment 9. Hereinafter, when there is no need to distinguish between the first transfer location L1 and the second transfer location L2, they may be collectively referred to as a "transfer location L".

Figure 2:
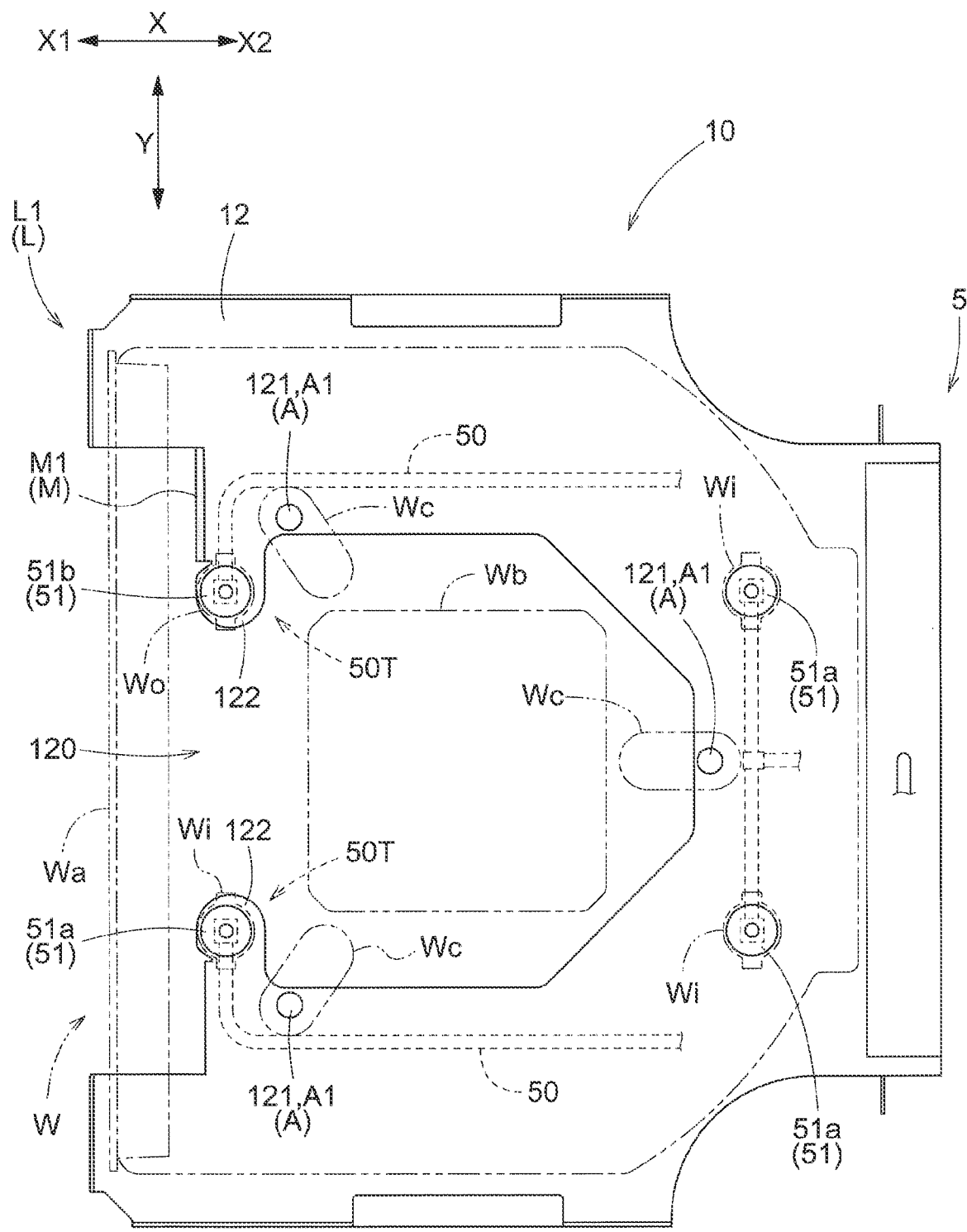
FIG. 2 is a plan view showing an accommodation section and an article accommodated in the accommodation section.
Figure 3:
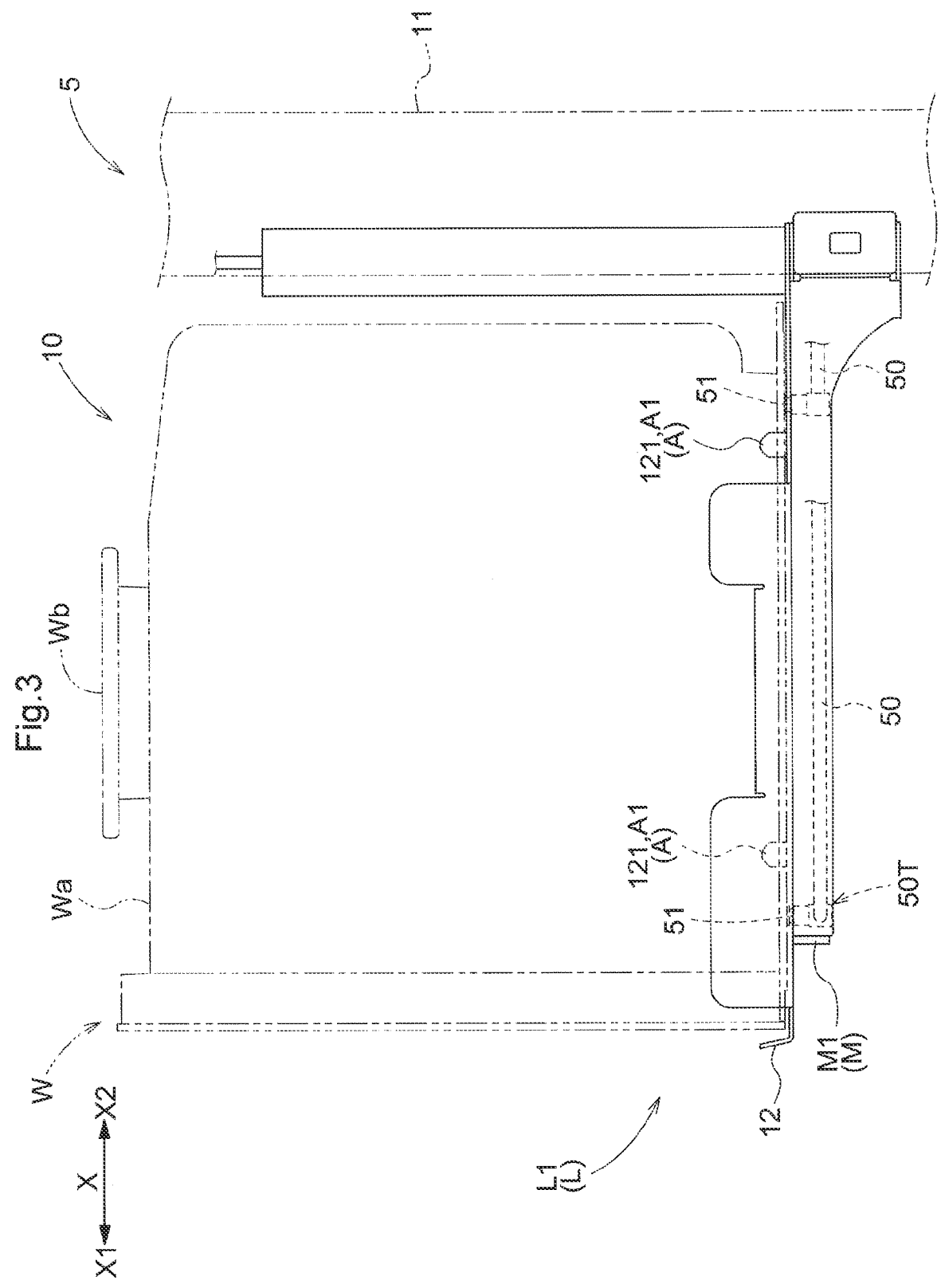
FIG. 3 is a side view showing an accommodation section and an article accommodated in the accommodation section.
Figure 4:
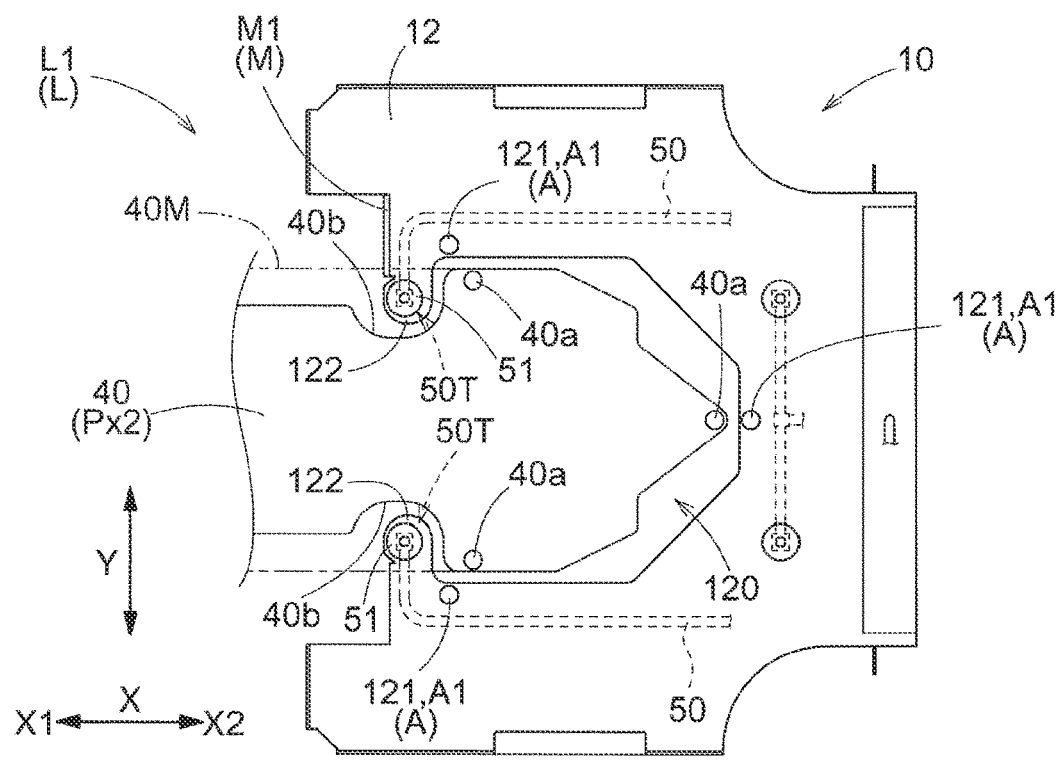
FIG. 4 is a plan view showing an accommodation section, and a fork that performs transfer to and from the accommodation section.

FIGS. 2 to 4 show the first transfer location L1. Specifically, FIGS. 2 and 3 show a relationship between an accommodation section 10 in which the first transfer location L1 is provided, and an article W accommodated in the accommodation section 10. FIG. 4 shows a relationship between the accommodation section 10 and the fork 40. Hereinafter, the side in the projecting/retracting direction X toward which the fork 40 is retracted is a "retraction side X1", and the side toward which the fork 40 is projected is a "projecting side X2". A direction that is orthogonal to the projecting/retracting direction X in a vertical view is a "width direction Y".

As shown in FIGS. 2 and 3, the article W includes a main body portion Wa, a held portion Wb, and at least one engaging groove Wc. The main body portion Wa is a portion that stores the storage target object, and is formed in the shape of a box. The held portion Wb is formed projecting upward from the main body portion Wa, and is formed in the shape of a flange in the present example. The held portion Wb is a portion that is held by the external transport device 8 (see FIG. 1) when the external transport device 8 transfers the article W. The engaging groove Wc is formed in a bottom surface of the main body portion Wa in such a manner as to be recessed upward from the bottom surface. The engaging groove Wc is a portion with which a support pin 40a of the fork 40 and a first placement pin 121 of the accommodation section 10 engage, as will be described later. As a result of the engaging groove Wc engaging with these pins, the article W is positioned in the horizontal direction.

In the present embodiment, the article W is configured to receive a gas supplied from the gas supply section 5. Supply ports Wi for injecting the gas supplied from the gas supply section 5, and an exhaust port Wo for discharging the gas existing in the internal space of the article W are formed in the bottom surface of the main body portion Wa. For example, a process for removing, from the inside of the article W, oxygen or the like that is likely to cause deterioration of a substance through oxidation is performed by supplying an inactive gas (an example of the gas) into the article W. Such a process is called purging.

The placement plate 12 is disposed in the accommodation section 10. The article W is accommodated in the accommodation section 10 while placed on the placement plate 12. In addition, the gas supply section 5 is disposed in the accommodation section 10. The gas supply section 5 is configured to supply a gas into the article W accommodated in the accommodation section 10. The gas supplied by the gas supply section 5 is an inactive gas such as a nitrogen gas, and keeps the inside of the article W clean, thus suppressing deterioration or the like of the semiconductor substrate (storage target object) stored inside the article W. The main portions (a gas generator, a control unit, etc.) of the gas supply section 5 are disposed on the projecting side X2 relative to the placement plate 12.

A passage portion 120 that allows the fork 40 (see FIG. 4) to pass therethrough in the vertical direction is formed in the placement plate 12. Due to the formation of the passage portion 120, the placement plate 12 is formed in such a manner as to have a central portion in the width direction Y that is open toward the retraction side X1, and the placement plate 12 has an approximately U-shape in a vertical view.

At least one first placement pin 121 that projects upward is formed on an upper surface of the placement plate 12. When an article W is placed on the first placement pin 121, the first placement pin 121 positions the article W in the horizontal direction. More specifically, as a result of the first placement pin 121 engaging with the engaging groove We formed in the bottom surface of the main body portion Wa of the article W, the article W is placed on the first placement pin 121, and is positioned in the horizontal direction.

In the present embodiment, a plurality of first placement pins 121 are provided around the passage portion 120 of the placement plate 12. In the example shown in FIG. 2, three first placement pins 121 are disposed such that lines connecting the first placement pins 121 to each other form a triangle in a vertical view. Two of the three first placement pins 121 are disposed at the same position in the projecting/retracting direction X in such a manner as to be spaced apart in the width direction Y. The remaining one of the three first placement pins 121 is disposed on the projecting side X2 relative to the other two first placement pins 121 at an intermediate position in the width direction Y between the two first placement pin 121. In the present embodiment, the first placement pin 121 corresponds to a "placement portion", and constitutes a portion where the article W is placed at the transfer location L. Here, a placement portion A provided at the first transfer location L1 of the transfer locations L is a "first placement portion A1". That is, the first placement pin 121 corresponds to the first placement portion A1.

In the present embodiment, the placement plate 12 is provided with at least one bulging portion 122 that bulges inward (toward the passage portion 120 side) in the width direction Y. In the present example, a pair of bulging portions 122 are disposed at the same position in the projecting/retracting direction X in such a manner as to be spaced apart in the width direction Y. That is, in the present example, the two bulging portions 122 are disposed at positions respectively corresponding to the two first placement pins 121 disposed at the same position in the projecting/retracting direction X in such a manner as to be spaced apart in the width direction Y. Each of the two bulging portions 122 bulges inward in the width direction Y relative to the corresponding first placement pin 121. In addition, each of the two bulging portions 122 is disposed on the retraction side X1 relative to the corresponding first placement pin 121. Note that the term "inward" above means a direction toward a central position of the accommodation section 10 in the width direction Y.

In the present embodiment, each gas supply section 5 includes a pipe 50 through which the gas passes, and at least one nozzle 51 that connects the pipe 50 and the article W accommodated in the accommodation section 10. In the present embodiment, the gas supply section 5 includes a plurality of nozzles 51. The plurality of nozzles 51 include supply nozzles 51a connected to the corresponding supply ports Wi of the article W, and an exhaust nozzle 51b connected to the exhaust port Wo of the article W. In the illustrated example, three supply nozzles 51a and one exhaust nozzle 51b are disposed in the accommodation section 10. Hereinafter, when there is no need to distinguish between the supply nozzle 51a and the exhaust nozzle 51b, they are collectively referred to as a "nozzle 51".

In the present embodiment, some of the plurality of nozzles 51 are disposed on the bulging portions 122. In the illustrated example, a supply nozzle 51a is disposed on one of the two bulging portions 122, and the exhaust nozzle 51b is disposed on the other bulging portion 122.

The pipe 50 projects downward from each of the plurality of nozzles 51, and extends below the placement plate 12 in the extension direction of the placement plate 12. In the present example, the pipe 50 is provided overlapping the placement plate 12 in a vertical view. Also, as shown in FIG. 4, the pipe 50 has a target portion 50T as at least one portion disposed at a position of the accommodation section 10 that is located below the first placement portion A1 (first placement pin 121), and that overlaps a movement trajectory 40M of the fork 40 in a vertical view. In the present example, the target portion 50T of the pipe 50 is a portion overlapping each of the bulging portions 122 in a vertical view. In other words, the target portion 50T is a portion of the pipe 50 that projects downward from the nozzle 51 (the supply nozzle 51a or the exhaust nozzle 51b) disposed on the corresponding bulging portion 122. Note that the movement trajectory 40M of the fork 40 described above is a movement trajectory when the fork 40 is projected or retracted in the projecting/retracting direction X.

As shown in FIG. 4, in the present embodiment, at least one support pin 40a that projects upward is provided on the upper surface of the fork 40. The support pin 40a supports the article W from below, and positions the article W in the horizontal direction. More specifically, as a result of the support pin 40a engaging with the engaging groove We (see FIG. 2) formed in the bottom surface of the main body portion Wa of the article W, the article W is supported by the support pin 40a, and is positioned in the horizontal direction.

In the present embodiment, a plurality of support pins 40a are provided on the upper surface of the fork 40. In the example shown in FIG. 4, three support pins 40a are disposed such that lines connecting the three support pins 40a form a triangle in a vertical view. Two of the three support pins 40a are disposed at the same position in the projecting/retracting direction X in such a manner as to be spaced apart in the width direction Y. The remaining one of the three support pins 40a is disposed on the projecting side X2 relative to the other two support pins 40a at an intermediate position between the two support pins 40a in the width direction Y. In the present embodiment, the support pin 40a corresponds to a "support portion", and constitutes a portion where the fork 40 supports the article W.

In the present embodiment, the fork 40 has at least one cut-out portion 40b formed therein. The cut-out portion 40b is formed in a portion that overlaps in a vertical view the target portion 50T disposed corresponding to each of the accommodation sections 10 while the fork 40 is disposed at the projecting position Px2 in order to perform the transfer operation to and from the accommodation section 10. In the present example, the cut-out portion 40b is disposed at a position opposing the bulging portion 122 in the horizontal direction while the fork 40 is disposed in the passage portion 120 of the placement plate 12. Although the fork 40 has a portion disposed outward of the bulging portion 122 in the width direction Y in this state, this portion will not interfere with the bulging portion 122 due to the presence of the cut-out portion 40b. As described above, the target portion 50T of the pipe 50 is disposed at a position overlapping the bulging portion 122 in a vertical view. Therefore, even if the fork 40 disposed at the projecting position Px2 is raised or lowered from that position, the fork 40 will not interfere with the bulging portion 122, and also will not interfere with the target portion 50T. This allows the fork 40 disposed at the projecting position Px2 to pass through the passage portion 120 in the vertical direction, while avoiding interference with the placement plate 12, when the fork 40 is raised or lowered. The fork 40 delivers the article W to the placement plate 12 (accommodation section 10) by passing through the passage portion 120 downward from above, while supporting the article W. Conversely, the fork 40 receives the article W from the placement plate 12 (accommodation section 10) by passing through the passage portion 120 upward from below, with the article W placed on the placement plate 12.

In the present embodiment, the cut-out portion 40*b* has a shape resulting from a portion of an edge of the fork 40 in the width direction Y being cut out toward the center in the width direction Y. In the present example, the fork 40 has a pair of cut-out portions 40*b* formed therein. The pair of cut-out portions 40*b* are formed on opposite sides of the fork 40 in the width direction Y at the same position of the fork 40 in the projecting/retracting direction X. That is, in the present example, the fork 40 has a portion in the projecting/retracting direction X that is narrowed in the width direction Y by the pair of cut-out portions 40*b*.

Figure 5:
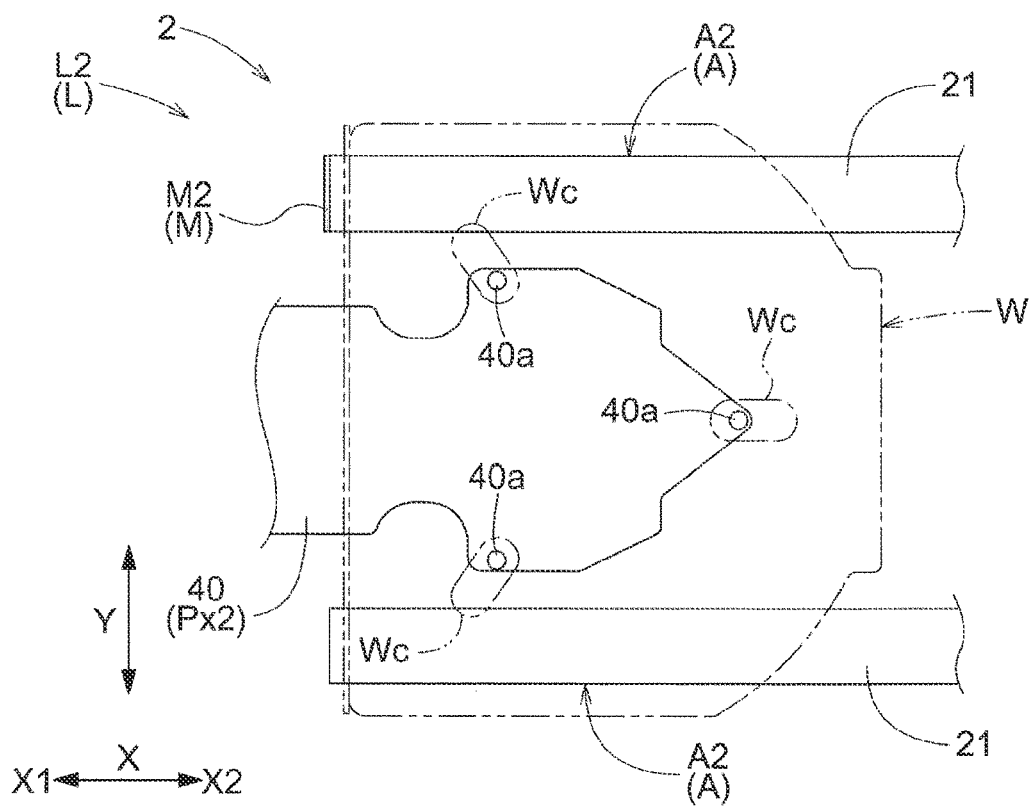
FIG. 5 is a plan view showing a storage/retrieval section, and a fork that performs transfer to and from the storage/retrieval section.

FIG. 5 shows a transfer location L provided in the storage/retrieval section 2, or in other words, a second transfer location L2. Specifically, FIG. 5 shows a relationship between the storage/retrieval section 2 in which the second transfer location L2 is provided, an article W, and the fork 40.

As shown in FIG. 5, the storage/retrieval section 2 includes a pair of placement members 21 disposed spaced apart in the width direction Y. The spacing between the two placement members 21 in the width direction Y is shorter than the length of the article W in the width direction Y. Accordingly, the pair of placement members 21 are configured to allow the article W to be placed thereon. A portion of the pair of placement members 21 on which the article W is placed corresponds to a "placement portion", and constitutes a portion where the article W is placed at the transfer location L. Here, a placement portion A that is provided at the second transfer location L2 of the transfer locations L is a "second placement portion A2". That is, a portion of the pair of placement members 21 on which the article W is placed corresponds to the second placement portion A2.

The spacing between the two placement members 21 in the width direction Y is larger than the length of the fork 40 in the width direction Y. Accordingly, the fork 40 can pass through the space between the two placement members 21 in the vertical direction. The fork 40 delivers the article W to the pair of placement members 21 (storage/retrieval section 2) by passing through the space between the two placement members 21 downward from above, while supporting the article W. Conversely, the fork 40 receives the article W from the pair of placement members 21 (storage/retrieval section 2) by passing through the space between the two placement members 21 upward from below, with the article W placed on the pair of placement members 21.

Figure 6:
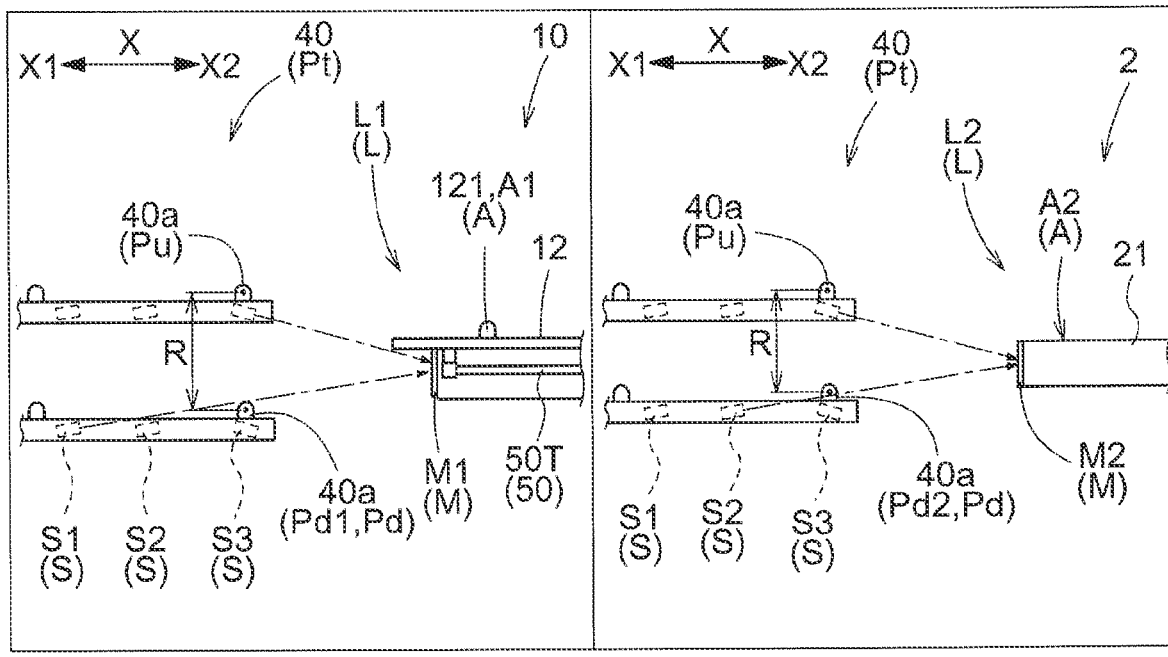
FIG. 6 is a diagram showing upper set positions and lower set positions corresponding to transfer locations.

FIG. 6 shows a state in which the fork 40 is located at a transfer preparation position Pt that is a preparation position before the transfer operation is performed. Specifically, the left part of FIG. 6 shows a state in which the fork 40 is located at the transfer preparation position Pt relative to the first transfer location L1 (accommodation section 10). The right part of FIG. 6 shows a state in which the fork 40 is located at the transfer preparation position Pt relative to the second transfer location L2 (storage/retrieval section 2). From the state of being located at the transfer preparation position Pt, the fork 40 is projected toward the transfer location L subject to the transfer operation in such a manner as to be located at the projecting position Px2 (see FIGS. 4 and 5), and is raised and lowered to and from the transfer location L from the state of being located at the projecting position Px2, thereby transferring the article W to and from the transfer location L. The transfer machine 4 raises and lowers the support pins 40*a* in the transfer operation between a lower set position Pd that is set below the placement portion A of the transfer location L subject to the transfer operation, and an upper set position Pu that is set above the placement portion A. Consequently, the article W is transferred to and from the transfer location L. In FIG. 6, the article W has been omitted in order to avoid the complexity of illustration.

In the present embodiment, the transfer machine 4 includes a position detector S that detects whether or not the fork 40 is located at the transfer preparation position Pt relative to a transfer location L subject to the transfer operation. Also, a detection target portion M that is detected by the position detector S when the fork 40 is located at the transfer preparation position Pt is provided on each of the plurality of accommodation sections 10 and the storage/retrieval section 2. The position detector S may be any well-known detection means such as a photosensor, an ultrasonic sensor, or a camera. The detection target portion M may be a reflective plate, a reflective seal, or a mark, or may be a portion of a member provided at the transfer location L.

Here, the detection target portion M provided on each of the plurality of accommodation sections 10 is a first detection target portion M1, and the detection target portion M provided on the storage/retrieval section 2 is a second detection target portion M2. In the present embodiment, the position detector S includes a first sensor S1 that detects the first detection target portion M1 while the fork 40 is located at the transfer preparation position Pt relative to the accommodation section 10, and a second sensor S2 that detects a second detection target portion M2 while the fork 40 is located at the transfer preparation position Pt relative to the storage/retrieval section 2.

As also shown in FIG. 4, in the present embodiment, the first detection target portion M1 is provided on the placement plate 12 of the accommodation section 10. Preferably, the first detection target portion M1 is provided on a surface of the placement plate 12 that faces toward the retraction side X1. In the example shown in FIG. 4, the first detection target portion M1 is provided at a part of the bulging portion 122 (one of the two bulging portions 122) that faces the retraction side X1.

As also shown in FIG. 5, in the present embodiment, the second detection target portion M2 is provided on the placement member 21 (one of the two placement members 21) of the storage/retrieval section 2. Preferably, the second detection target portion M2 is provided on a surface of the placement member 21 that faces toward the retraction side X1.

As shown in FIG. 6, in the present embodiment, the first sensor S1 and the second sensor S2 are provided in the fork 40. The first sensor S1 and the second sensor S2 have detection ranges that are different from each other. In the present example, the first sensor S1 and the second sensor S2 are fixed to the fork 40 such that the first sensor S1 and the second sensor S2 face toward the projecting side X2, and differ from each other by at least one of position and orientation. Accordingly, the detection range of the first sensor S1 and the detection range of the second sensor S2 with respect to the position of the fork 40 are different from each other. In FIGS. 4 and 5, the first sensor S1, the second sensor S2, and a third sensor S3 described below have been omitted.

As shown in FIG. 6, the support pin 40*a* is located at the lower set position Pd or the upper set position Pu while the fork 40 is located at the transfer preparation position Pt. In the present embodiment, the transfer operation includes a scooping operation for receiving the article W from the transfer location L, and an unloading operation for delivering the article W to the transfer location L. When the transfer machine 4 performs the scooping operation, the support pin 40a is disposed at the lower set position Pd while the fork 40 is located at the transfer preparation position Pt. When the transfer machine 4 performs the unloading operation, the support pin 40a is disposed at the upper set position Pu while the fork 40 is located at the transfer preparation position Pt.

The transfer machine 4 receives the article W placed on the placement portion A using the support pin 40a in the scooping operation by raising the support pin 40a from the lower set position Pd to the upper set position Pu relative to the placement portion A of the transfer location L subject to the scooping operation. The transfer machine 4 delivers the article W supported by the support pin 40a to the placement portion A in the unloading operation by lowering the support pin 40a from the upper set position Pu to the lower set position Pd relative to the placement portion A of the transfer location L subject to the unloading operation.

In the present embodiment, as the lower set position Pd of the support pin 40a relative to the first transfer location L1, a first lower set position Pd1 is set (see the left part of FIG. 6). As the lower set position Pd of the support pin 40a relative to the second transfer location L2, a second lower set position Pd2 is set (see the right part of FIG. 6). Also, the upper set position Pu is set relative to both the first transfer location L1 and the second transfer location L2.

Thus, in the present embodiment, the first lower set position Pd1, the second lower set position Pd2, and the upper set position Pu are set as the positions of the support pin 40a that are used when the transfer machine 4 transfers the article W.

As shown in the left part of FIG. 6, while the fork 40 is located at the transfer preparation position Pt used when the scooping operation is performed for the accommodation section 10, the support pin 40a is disposed at the first lower set position Pd1. In the present example, the first sensor S1 is configured to detect the first detection target portion M1 while the support pin 40a is disposed at the first lower set position Pd1. While the fork 40 is located at the transfer preparation position Pt used when the unloading operation is performed for the accommodation section 10, the support pin 40a is disposed at the upper set position Pu. In the present example, the position detector S further includes a third sensor S3, and the third sensor S3 is configured to detect the first detection target portion M1 while the support pin 40a is disposed at the upper set position Pu.

As shown in the right part of FIG. 6, while the fork 40 is located at the transfer preparation position Pt used when the scooping operation is performed for the storage/retrieval section 2, the support pin 40a is disposed at the second lower set position Pd2. In the present example, the second sensor S2 is configured to detect the second detection target portion M2 while the support pin 40a is disposed at the second lower set position Pd2. While the fork 40 is located at the transfer preparation position Pt used when the unloading operation is performed for the storage/retrieval section 2, the support pin 40a is disposed at the upper set position Pu. In the present example, the third sensor S3 described above is configured to detect the second detection target portion M2 while the support pin 40a is disposed at the upper set position Pu. That is, in the present example, the position detector S includes the first sensor S1, the second sensor S2, and the third sensor S3. The first sensor S1 is configured to detect only the first detection target portion M1, the second sensor S2 is configured to detect only the second detection target portion M2, and the third sensor S3 is configured to be capable of detecting both the first detection target portion M1 and the second detection target portion M2.

In the present embodiment, when transferring the article W to the first placement portion A1 of the first transfer location L1, the transfer machine 4 raises and lowers the support pin 40a between the first lower set position Pd1 and the upper set position Pu, and determines whether or not the support pin 40a is properly located at each of the first lower set position Pd1 and the upper set position Pu, based on a result of detection by the first sensor S1 and a result of detection by the third sensor S3, respectively. When transferring the article W to the second placement portion A2 of the second transfer location L2, the transfer machine 4 raises and lowers the support pin 40a between the second lower set position Pd2 and the upper set position Pu, and determines whether or not the support pin 40a is properly located at each of the second lower set position Pd2 and the upper set position Pu, based on a result of detection by the second sensor S2 and a result of detection by the third sensor S3, respectively.

Next, a control configuration of the article accommodation facility 100 will be described.

Figure 7:
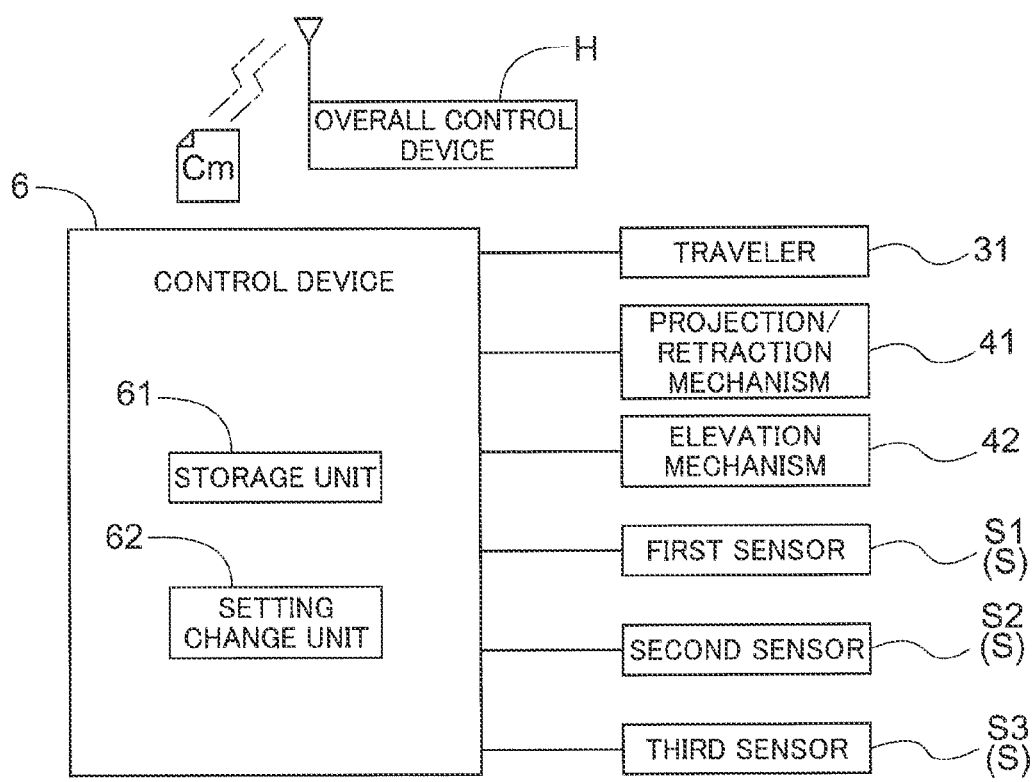
FIG. 7 is a control block diagram.

As shown in FIG. 7, the article accommodation facility 100 includes an overall control device H that manages the entire facility, and a control device 6 that controls the transport device 3 (see FIG. 1). The overall control device H and the control device 6 are configured to be capable of communicating with each other. The overall control device H is configured to transmit, to the control device 6, a transport instruction Cm, which is an instruction relating to the transport of the article W. The transport instruction Cm contains information on the transfer location L relating to a transport source and a transport destination. Also, the control device 6 is configured to control various parts of the transport device 3, based on the transport instruction Cm. The overall control device H and the control device 6 each include, for example, a processor such as a microcomputer, and a peripheral circuit such as a memory. Various functions are implemented by these pieces of hardware working cooperatively with a program executed on a processor such as a computer.

In the present embodiment, the control device 6 is configured to control the traveler 31, the projection/retraction mechanism 41, and the elevation mechanism 42, based on the transport instructions Cm transmitted from the overall control device H. Through this control, the control device 6 performs three-dimensional positioning for transferring the article W to and from the transfer location L contained in the transport instruction Cm.

In the present embodiment, the control device 6 is configured to be capable of acquiring detection results obtained by detecting the detection target portion M by the first sensor S1, the second sensor S2, and the third sensor S3. Based on the detection results obtained by these sensors, the control device 6 causes the transfer machine 4 to perform transfer of the article W to the target transfer location L.

The control device 6 changes setting of at least one of the lower set position Pd and the upper set position Pu to set a different raising/lowering range R (see FIG. 6) of the support pin 40a that covers a range from the lower set position Pd to the upper set position Pu, between a case where the article W is transferred to the transfer location L (second transfer location L2) provided in the storage/retrieval section 2, and a case where the article W is transferred to the transfer location L (first transfer location L1) provided in the accommodation section 10. In the present embodiment, the control device 6 sets a different raising/lowering range R according to the transfer location L by changing setting of the lower set position Pd, without changing setting of the upper set position Pu.

As shown in the left part of FIG. 6, in the present embodiment, the control device 6 sets the lower set position Pd below the target portion 50T of the pipe 50 when causing the transfer machine 4 to perform the transfer operation to and from the accommodation section 10. This can prevent the fork 40 from interfering with the target portion 50T of the pipe 50 when the fork 40 is projected or retracted for the transfer operation. In the present embodiment, the control device 6 sets the first lower set position Pd1 as the lower set position Pd when causing the transfer machine 4 to perform the scooping operation and the unloading operation for the accommodation section 10, or in other words, the first transfer location L1.

As shown in the right part of FIG. 6, in the present embodiment, the control device 6 sets the lower set position Pd below the second placement portion A2 when causing the transfer machine 4 to perform the transfer operation to and from the storage/retrieval section 2. In the present example, the control device 6 sets the second lower set position Pd2 as the lower set position Pd when causing the transfer machine 4 to perform the scooping operation and the unloading operation for the storage/retrieval section 2, or in other words, the second transfer location L2. The lower set position Pd (second lower set position Pd2) relative to the placement portion A (second placement portion A2) of the storage/retrieval section 2 is set above the lower set position Pd (first lower set position Pd1) relative to the placement portion A (first placement portion A1) of the accommodation section 10. Also, in the present example, the upper set position Pu for the placement portion A (second placement portion A2) of the storage/retrieval section 2 and the upper set position Pu for the placement portion A (first placement portion A1) of the accommodation section 10 are equal positions. Thus, the raising/lowering range R of the support pin 40a used when causing the transfer machine 4 to perform the transfer operation for the storage/retrieval section 2 (second transfer location L2) is set to be shorter than the raising/lowering range R of the support pin 40a used when causing the transfer machine 4 to perform the transfer operation to and from the accommodation section 10 (first transfer location L1). With such a configuration, the raising/lowering range R of the support pin 40a used when causing the transfer machine 4 to perform the transfer operation to and from the storage/retrieval section 2 (second transfer location L2) can be made relatively short, thus making it possible to reduce the time require for the transfer operation.

As shown in FIG. 7, in the present embodiment, the control device 6 includes a storage unit 61 and a setting change unit 62. The storage unit 61 stores the lower set position Pd and the upper set position Pu of the fork 40 that are used when the article W is transferred to each of the plurality of transfer locations L. The setting change unit 62 changes setting of at least one of the lower set position Pd and the upper set position Pu. In the present example, the setting change unit 62 changes setting of the lower set position Pd without changing setting of the upper set position Pu. The transport instruction Cm described above contains information on the transfer location L subject to the transfer, and information on a transfer operation that is to be performed at the transfer location L, or in other words, information as to whether to perform the scooping operation or the unloading operation. Based on these pieces of information contained in the transport instruction Cm, the setting change unit 62 acquires information on the lower set position Pd and information on the upper set position Pu from the storage unit 61 for each of the transfer locations L, and performs the above-described setting change.

In the present embodiment, when causing the transfer machine 4 to perform the scooping operation, the control device 6 causes the position detector S to detect the detection target portion M while the support pin 40a is disposed at the lower set position Pd relative to the transfer location L subject to the scooping operation. Then, after the detection has been performed, the control device 6 causes the transfer machine 4 to perform the scooping operation. Thus, when the transfer machine 4 is caused to perform the scooping operation, the fork 40 can be appropriately disposed at the transfer preparation position Pt before the scooping operation is performed. Accordingly, the scooping operation is likely to be performed appropriately.

In the present embodiment, when causing the transfer machine 4 to perform the unloading operation, the control device 6 causes the position detector S to detect the detection target portion M while the support pin 40a is disposed at the upper set position Pu relative to the transfer location L subject to the unloading operation. Then, after the detection has been performed, the control device 6 causes the transfer machine 4 to perform the unloading operation. Thus, when the transfer machine 4 is caused to perform the unloading operation, the fork 40 can be appropriately disposed at the transfer preparation position Pt before the unloading operation is performed. Accordingly, the unloading operation is likely to be performed appropriately.

Next, a processing procedure performed in the article accommodation facility 100 will be described with reference to the flowchart of FIG. 8.

Based on the transport instruction Cm, the control device 6 determines whether the transfer location L subject to the transfer is the first transfer location L1 or the second transfer location L2 (step #1). If the control device 6 determines that the transfer location L subject to the transfer is the first transfer location L1 (step #1: Yes), the control device 6 sets the lower set position Pd to the first lower set position Pd1 (step #11).

Thereafter, based on the transport instruction Cm, the control device 6 determines whether the transfer operation that is to be performed at the first transfer location L1 is the scooping operation or the unloading operation (step #12). If the control device 6 determines that the transfer operation that is to be performed at the first transfer location L1 is the scooping operation (step #12: Yes), the control device 6 causes the transport device 3 to operate to dispose the support pin 40a at the first lower set position Pd1 (step #13). Next, in order to determine whether or not the support pin 40a is disposed at the first lower set position Pd1, the control device 6 causes the first sensor S1 to detect the first detection target portion M1 (step #14). Then, if the first sensor S1 successfully detects the first detection target portion M1 (step #15: Yes), the control device 6 causes the support pin 40a to be raised from the first lower set position Pd1 to the upper set position Pu at the first transfer location L1 to perform the scooping operation (step #16). On the other hand, if the first sensor S1 fails to detect the first detection target portion M1 (step #15: No), the control device 6 returns to step #13, and causes the transport device 3 to operate again to perform an operation for disposing the support pin 40a at the first lower set position Pd1 (retry operation). If, as a result of the retry operation, the first sensor S1 successfully detects the first detection target portion M1 (step #15: Yes), the scooping operation is performed (step #16). Although not shown, if the first sensor S1 fails to detect the first detection target portion M1 even after the retry operation has been performed for a predetermined number of times, the control device 6 stops the transfer operation, and notifies the overall control device H of an error.

If the control device 6 determines in step #12 that the transfer operation that is to be performed at the first transfer location L1 is the unloading operation (step #12: No), the control device 6 causes the transport device 3 to operate to dispose the support pin 40*a* at the upper set position Pu (step #17). Next, in order to determine whether or not the support pin 40*a* is disposed at the upper set position Pu, the control device 6 causes the third sensor S3 to detect the first detection target portion M1 (step #18). Then, if the third sensor S3 successfully detects the first detection target portion M1 (step #19: Yes), the control device 6 causes the support pin 40*a* to be lowered from the upper set position Pu to the first lower set position Pd1 at the first transfer location L1 to perform the unloading operation (step #20). On the other hand, if the third sensor S3 fails to detect the first detection target portion M1 (step #19: No), the control device 6 returns to step #17, and causes the transport device 3 to operate again to perform an operation for disposing the support pin 40*a* at the upper set position Pu (retry operation). If, as a result of the retry operation, the third sensor S3 successfully detects the first detection target portion M1 (step #19: Yes), the unloading operation is performed (step #20). Although not shown, if the third sensor S3 fails to detect the first detection target portion M1 even after the retry operation has been performed for a predetermined number of times, the control device 6 stops the transfer operation, and notifies the overall control device H of an error.

If the control device 6 determines in step #1 that the transfer location L subject to the transfer is the second transfer location L2 (step #1: No), the control device 6 sets the lower set position Pd to the second lower set position Pd2 (step #21).

Thereafter, based on the transport instruction Cm, the control device 6 determines whether the transfer operation that is to be performed at the second transfer location L2 is the scooping operation or the unloading operation (step #22). If the control device 6 determines that the transfer operation that is to be performed at the second transfer location L2 is the scooping operation (step #22: Yes), the control device 6 causes the transport device 3 to operate to dispose the support pin 40*a* at the second lower set position Pd2 (step #23). Next, in order to determine whether or not the support pin 40*a* is disposed at the second lower set position Pd2, the control device 6 causes the second sensor S2 to detect the second detection target portion M2 (step #24). Then, if the second sensor S2 successfully detects the second detection target portion M2 (step #25: Yes), the control device 6 causes the support pin 40*a* to be raised from the second lower set position Pd2 to the upper set position Pu at the second transfer location L2 to perform the scooping operation (step #26). On the other hand, if the second sensor S2 fails to detect the second detection target portion M2 (step #25: No), the control device 6 returns to step #23, and causes the transport device 3 to operate again to perform an operation for disposing the support pin 40*a* at the second lower set position Pd2 (retry operation). If, as a result of the retry operation, the second sensor S2 successfully detects the second detection target portion M2 (step #25: Yes), the scooping operation is performed (step #26). Although not shown, if the second sensor S2 fails to detect the second detection target portion M2 even after the retry operation has been performed for a predetermined number of times, the control device 6 stops the transfer operation, and notifies the overall control device H of an error.

If the control device 6 determines in step #22 that the transfer operation that is to be performed at the second transfer location L2 is the unloading operation (step #22: No), the control device 6 causes the transport device 3 to operate to dispose the support pin 40*a* at the upper set position Pu (step #27). Next, in order to determine whether or not the support pin 40*a* is disposed at the upper set position Pu, the control device 6 causes the third sensor S3 to detect the second detection target portion M2 (step #28). Then, if the third sensor S3 successfully detects the second detection target portion M2 (step #29: Yes), the control device 6 causes the support pin 40*a* to be lowered from the upper set position Pu to the second lower set position Pd2 at the second transfer location L2 to perform the unloading operation (step #30). On the other hand, if the third sensor S3 fails to detect the second detection target portion M2 (step #29: No), the control device 6 returns to step #27, and causes the transport device 3 to operate again to perform an operation for disposing the support pin 40*a* at the upper set position Pu (retry operation). If, as a result of the retry operation, the third sensor S3 successfully detects the second detection target portion M2 (step #29: Yes), the unloading operation is performed (step #30). Although not shown, if the third sensor S3 fails to detect the second detection target portion M2 even after the retry operation has been performed for a predetermined number of times, the control device 6 stops the transfer operation, and notifies the overall control device H of an error.

With the article accommodation facility 100 described thus far, even in the case where the restriction on the raising/lowering range R of the support pin 40*a* (support portion) during the transfer operation differs according to the transfer location L, including, for example, a case where the structure of the second transfer location L2 provided in the storage/retrieval section 2 and the structure of the first transfer location L1 provided in the accommodation section 10 differ from each other, it is possible to set an appropriate raising/lowering range R suitable for each of the transfer locations L, and transfer the article W appropriately. Accordingly, when a plurality of transfer locations L having different structures are present, it is possible to perform an appropriate transfer operation suitable for each of the transfer locations L.

Other Embodiments

Next, other embodiments of the article accommodation facility will be described.

(1) The above embodiment has described an example in which the control device 6 sets a different raising/lowering range R according to the transfer location L by changing setting of the lower set position Pd without changing setting of the upper set position Pu. However, the present disclosure is not limited to such an example, and the control device 6 may set a different raising/lowering range R according to the transfer location L by changing setting of only the upper set position Pu, or changing settings of both the upper set position Pu and the lower set position Pd.

(2) The above embodiment has described an example in which the lower set position Pd (second lower set position Pd2) relative to the placement portion A (second placement portion A2) of the storage/retrieval section 2 is set above the lower set position Pd (first lower set position Pd1) relative to the placement portion A (first placement portion A1) of the accommodation section 10. However, the present disclosure is not limited to such an example, and the second lower set position Pd2 may be set below the first lower set position Pd1, or these lower set positions Pd may be set at equal positions.

(3) The above embodiment has described an example in which the transfer operation includes a scooping operation for receiving the article W from the transfer location L, and an unloading operation for delivering the article W to the transfer location L. However, the present disclosure is not limited to such an example, and the transfer operation only needs to include at least one of the scooping operation and the unloading operation.

(4) The above embodiment has described an example in which the position detector S further includes the third sensor S3 in addition to the first sensor S1 and the second sensor S2, and the third sensor S3 is configured to detect the first detection target portion M1 or the second detection target portion M2 while the support pin 40a is disposed at the upper set position Pu. However, the present disclosure is not limited to such an example, and a third detection target portion may be provided separately from the first detection target portion M1 and the second detection target portion M2, and the third sensor S3 may be configured to detect the third detection target portion. Then, whether or not the support pin 40a is disposed at the upper set position Pu may be determined based on detection of the third detection target portion by the third sensor S3.

(5) The above embodiment has described an example in which the transfer machine 4 includes the position detector S that detects whether or not the fork 40 is located at the transfer preparation position Pt relative to the transfer location L subject to the transfer operation. However, the present disclosure is not limited to such an example, and the transfer machine 4 need not include such a position detector S. Accordingly, the detection target portion M that is to be detected by the position detector S need not be provided in each of the plurality of accommodation sections 10 and the storage/retrieval section 2.

(6) The above embodiment has described an example in which the article is a container in which a storage target object is storable. However, the present disclosure is not limited to such an example, and the article need not be a container in which a storage target object is storable, but may itself be an object that is to be transported or stored.

(7) The above embodiment has described an example in which the article accommodation facility 100 includes the gas supply section 5 that supplies a gas into the article W. However, the present disclosure is not limited to such an example, and the article accommodation facility 100 need not include the gas supply section 5.

(8) Note that the configurations disclosed in the embodiments described above are applicable in combination with configurations disclosed in other embodiments as long as no inconsistency arises. With regard to the other configurations as well, the embodiments disclosed herein are illustrative in all respects. Therefore, various modifications and alterations may be made as appropriate without departing from the gist of the present disclosure.

Outline of the Embodiment

Below, an outline of the article accommodation facility described above will be described.

An article accommodation facility including:

an article accommodation rack including a plurality of accommodation sections each configured to accommodate an article;

a storage/retrieval section configured to store the article on the article accommodation rack, and retrieve the article from the article accommodation rack;

a transport device configured to transport the article; and a control device configured to control the transport device, wherein the transport device includes a transfer machine configured to transfer the article to and from a transfer location provided in each of the plurality of accommodation sections and the storage/retrieval section, the transfer machine includes a fork configured to support the article from below, a projection/retraction mechanism configured to project and retract the fork between a retracted position and a projecting position in a projecting/retracting direction extending in a horizontal direction, and an elevation mechanism configured to raise and lower the fork, and is configured to perform a transfer operation for transferring the article to and from the transfer locations by projecting or retracting and raising or lowering the fork, each of the transfer locations has a placement portion where the article is placed, and a support portion where the fork supports the article, the transfer machine raises and lowers the support portion in the transfer operation between a lower set position that is set below the placement portion of the transfer location subject to the transfer operation, and an upper set position that is set above the placement portion, and the control device changes setting of at least one of the lower set position and the upper set position to set a different raising/lowering range of the support portion that covers a range from the lower set position to the upper set position, between a case where the article is transferred to the transfer location provided in the storage/retrieval section, and a case where the article is transferred to the transfer location provided in each of the accommodation sections.

With this configuration, even in the case where the restriction on the raising/lowering range of the support portion during the transfer operation differs according to the transfer location, including, for example, a case where the structure of the transfer location provided in the storage/retrieval section and the structure of the transfer location provided in the accommodation section differ from each other, it is possible to set an appropriate raising/lowering range suitable for each of the transfer locations, and transfer the article appropriately. Accordingly, with this configuration, when a plurality of transfer locations having different structures are present, it is possible to perform an appropriate transfer operation suitable for each of the transfer locations.

Here, it is preferable that the transfer machine includes a position detector configured to detect whether or not the fork is located at a transfer preparation position that is a preparation position before the transfer operation is performed, relative to the transfer location subject to the transfer operation, the support portion is located at the lower set position or the upper set position while the fork is located at the transfer preparation position, a detection target portion that is detected by the position detector when the fork is located at the transfer preparation position is provided on each of the plurality of accommodation sections and the storage/retrieval section, and with the detection target portion provided on each of the plurality of accommodation sections being a first detection target portion, and the detection target portion provided on the storage/retrieval section being a second detection target portion, the position detector includes a first sensor configured to detect the first detection target portion while the fork is located at the transfer preparation position relative to each of the accommodation sections, and a second sensor configured to detect the second detection target portion while the fork is located at the transfer preparation position relative to the storage/retrieval section.

With this configuration, the position detector separately includes the first sensor for detecting the first detection target portion, and the second sensor for detecting the second detection target portion. Accordingly, with this configuration, whether or not the fork is located at the transfer preparation positions respectively corresponding to the different transfer locations can be appropriately detected using two sensors.

In the above-described configured to, it is preferable that the transfer operation includes a scooping operation for receiving the article from the transfer location, and an unloading operation for delivering the article to the transfer location, when the transfer machine performs the scooping operation, the support portion is disposed at the lower set position while the fork is located at the transfer preparation position, when the transfer machine performs the unloading operation, the support portion is disposed at the upper set position while the fork is located at the transfer preparation position, the transfer machine is configured to receive the article placed on the placement portion using the support portion in the scooping operation by raising the support portion from the lower set position to the upper set position relative to the placement portion of the transfer location subject to the scooping operation, deliver the article supported by the support portion to the placement portion in the unloading operation by lowering the support portion from the upper set position to the lower set position relative to the placement portion of the transfer location subject to the unloading operation, and the control device is configured to:

when causing the transfer machine to perform the scooping operation, cause the position detector to detect the detection target portion while the support portion is disposed at the lower set position relative to the transfer location subject to the scooping operation, and when causing the transfer machine to perform the unloading operation, cause the position detector to detect the detection target portion while the support portion is disposed at the upper set position relative to the transfer location subject to the unloading operation.

With this configuration, when the transfer machine is caused to perform the scooping operation, and when the transfer machine is caused to perform the unloading operation, the fork can be appropriately disposed to the transfer preparation position before each of the operations is performed. Accordingly, each of the scooping operation and the unloading operation is likely to be performed appropriately.

It is preferable that the article is a container in which a storage target object is storable, the article accommodation facility further includes a gas supply section configured to supply a gas into the article, the gas supply section includes a pipe through which the gas passes, and a nozzle configured to connect the pipe and the article accommodated in each of the accommodation sections, the pipe has a target portion as at least one portion disposed at a position that is located below the placement portion of each of the accommodation sections, and that overlaps a movement trajectory of the fork in a vertical view taken in a vertical direction, the control device sets the lower set position below the target portion when causing the transfer machine to perform the transfer operation to and from each of the accommodation sections, and the lower set position relative to the placement portion of the storage/retrieval section is set above the lower set position relative to the placement portion of each of the accommodation sections.

With this configuration, the target portion of the pipe is disposed at a position that is located below the placement portion of the accommodation section, and that overlaps a movement trajectory of the fork in a vertical view taken in the vertical direction. Accordingly, before the fork is projected toward the accommodation section, the position of the fork in the vertical direction needs to be set such that the fork does not interfere with the target portion of the pipe. With this configuration, when causing the transfer operation to perform the transfer machine to and from the accommodation section, the control device sets the lower set position below the target portion of the pipe, and it is thus possible to prevent the fork from interfering with the target portion of the pipe. Furthermore, with this configuration, as described above, it is not necessary to take the interference between the fork and the target portion of the pipe into consideration when the transfer operation is performed to and from the storage/retrieval section. Accordingly, the raising/lowering range of the support portion can be made relatively small by setting the lower set position relative to the placement portion of the storage/retrieval section above the lower set position relative to the placement portion of the accommodation section, thus reducing the time required for the transfer operation.

In the above-described configuration, it is preferable that the fork has a cut-out portion formed therein, the cut-out portion is formed in a portion of the fork that overlaps in the vertical view the target portion disposed corresponding to each of the accommodation sections while the fork is disposed at the projecting position in order to perform the transfer operation to and from the accommodation section.

With this configuration, even if the support portion is raised and lowered over the raising/lowering range while the fork is disposed at the projecting position in order to perform the transfer operation to and from the accommodation section, the target portion of the pipe can pass through the cut-out portion, and it is thus possible to prevent interference between the target portion of the pipe and the fork. Accordingly, with this configuration, the transfer operation can be appropriately performed to and from the accommodation section.

The technique according to the present disclosure is applicable to an article accommodation facility.

What is claimed is:

1. An article accommodation facility comprising:
    an article accommodation rack comprising a plurality of accommodation sections each configured to accommodate an article;
    a storage/retrieval section configured to store the article on the article accommodation rack, and retrieve the article from the article accommodation rack;
    a transport device configured to transport the article; and
    a control device configured to control the transport device, wherein:

the transport device comprises a transfer machine configured to transfer the article to and from a transfer location provided in each of the plurality of accommodation sections and the storage/retrieval section, the transfer machine comprises a fork configured to support the article from below, a projection/retraction mechanism configured to project and retract the fork between a retracted position and a projecting position in a projecting/retracting direction extending in a horizontal direction, and an elevation mechanism configured to raise and lower the fork, the transfer machine is configured to perform a transfer operation for transferring the article to and from the transfer locations by one of: projecting or retracting, and one of: raising or lowering the fork, each of the transfer locations has a placement portion where the article is placed, and a support portion where the fork supports the article, the transfer machine is configured to raise or lower the support portion in the transfer operation between a lower set position that is set below the placement portion of the transfer location subject to the transfer operation, and an upper set position that is set above the placement portion, and the control device is configured to change a setting of at least one of the lower set position and the upper set position to set a different raising/lowering range of the support portion that covers a range from the lower set position to the upper set position, between a case where the article is transferred to the transfer location provided in the storage/retrieval section, and a case where the article is transferred to the transfer location provided in each of the accommodation sections.

2. The article accommodation facility according to claim 1, wherein:

the transfer machine comprises a position detector configured to detect whether or not the fork is located at a transfer preparation position that is a preparation position before the transfer operation is performed, relative to the transfer location subject to the transfer operation, the support portion is located at the lower set position or the upper set position while the fork is located at the transfer preparation position, a detection target portion, that is detected by the position detector when the fork is located at the transfer preparation position, is provided on each of the plurality of accommodation sections and the storage/retrieval section, and the detection target portion provided on each of the plurality of accommodation sections is a first detection target portion, and the detection target portion provided on the storage/retrieval section is a second detection target portion, the position detector comprises a first sensor configured to detect the first detection target portion while the fork is located at the transfer preparation position relative to each of the accommodation sections, and a second sensor configured to detect the second detection target portion while the fork is located at the transfer preparation position relative to the storage/retrieval section.

3. The article accommodation facility according to claim 2, wherein:

the transfer operation includes a scooping operation for receiving the article from the transfer location, and an unloading operation for delivering the article to the transfer location, when the transfer machine performs the scooping operation, the support portion is disposed at the lower set position while the fork is located at the transfer preparation position, when the transfer machine performs the unloading operation, the support portion is disposed at the upper set position while the fork is located at the transfer preparation position, the transfer machine is configured to:

receive the article placed on the placement portion using the support portion in the scooping operation by raising the support portion from the lower set position to the upper set position relative to the placement portion of the transfer location subject to the scooping operation, deliver the article supported by the support portion to the placement portion in the unloading operation by lowering the support portion from the upper set position to the lower set position relative to the placement portion of the transfer location subject to the unloading operation, and the control device is configured to:

when causing the transfer machine to perform the scooping operation, cause the position detector to detect the detection target portion while the support portion is disposed at the lower set position relative to the transfer location subject to the scooping operation, and when causing the transfer machine to perform the unloading operation, cause the position detector to detect the detection target portion while the support portion is disposed at the upper set position relative to the transfer location subject to the unloading operation.

4. The article accommodation facility according to claim 1, wherein:

the article is a container in which a storage target object is storable, the article accommodation facility further comprises a gas supply section configured to supply a gas into the article, the gas supply section comprises a pipe through which the gas passes, and a nozzle configured to connect the pipe and the article accommodated in each of the accommodation sections, the pipe has a target portion as at least one portion disposed at a position that is located below the placement portion of each of the accommodation sections, and overlaps a movement trajectory of the fork in a vertical view taken in a vertical direction, the control device sets the lower set position below the target portion when causing the transfer machine to perform the transfer operation to and from each of the accommodation sections, and the lower set position relative to the placement portion of the storage/retrieval section is set above the lower set position relative to the placement portion of each of the accommodation sections.

5. The article accommodation facility according to claim 4,
wherein the fork has a cut-out portion formed therein, and
wherein the cut-out portion is formed in a portion of the fork that overlaps in the vertical view the target portion disposed corresponding to each of the accommodation sections while the fork is disposed at the projecting position in order to perform the transfer operation to and from the accommodation section.

* * * * *